(12) United States Patent
Roodnat et al.

(10) Patent No.: US 8,995,506 B2
(45) Date of Patent: Mar. 31, 2015

(54) TRANSCEIVER WITH SUB-SAMPLING BASED FREQUENCY SYNTHESIZER

(75) Inventors: Anton Willem Roodnat, Everdingen (NL); Hans Van Driest, The Hague (NL); Jan Hendrik Haanstra, Nijmegen (NL)

(73) Assignee: Greenpeak Technologies B.V., Utrecht (NL)

( * ) Notice: Subject to any disclaimer, the term of this patent is extended or adjusted under 35 U.S.C. 154(b) by 0 days.

(21) Appl. No.: 13/977,299

(22) PCT Filed: Dec. 31, 2010

(86) PCT No.: PCT/NL2010/050900
§ 371 (c)(1),
(2), (4) Date: Jun. 28, 2013

(87) PCT Pub. No.: WO2012/091544
PCT Pub. Date: Jul. 5, 2012

(65) Prior Publication Data
US 2014/0036970 A1    Feb. 6, 2014

(51) Int. Cl.
*H03B 21/00* (2006.01)
*H03L 7/16* (2006.01)

(52) U.S. Cl.
CPC *H03B 21/00* (2013.01); *H03L 7/16* (2013.01); *H03L 2207/12* (2013.01); *H04B 1/408* (2013.01)
USPC .......................................................... 375/219

(58) Field of Classification Search
CPC .... H03B 21/00; H03B 1/408; H03L 2207/12; H03L 7/16
USPC .......................................................... 375/219
See application file for complete search history.

(56) References Cited

U.S. PATENT DOCUMENTS 5,343,169 A * 8/1994 Debaty ........................... 331/17
5,444,420 A * 8/1995 Wernlund ..................... 331/1 R
(Continued)

FOREIGN PATENT DOCUMENTS

WO    2011/119022 A1    9/2011

OTHER PUBLICATIONS

Gao et al.: "A Low Noise Sub-Sampling PLL in Which Divider Noise is Eliminated and PD/CP Noise is Not Multiplied by N2", Journal of Solid-State Circuits, vol. 44, No. 12, Dec. 2009, p. 3253-3263.
(Continued)

*Primary Examiner* — Daniel Washburn
(74) *Attorney, Agent, or Firm* — Young & Thompson

(57) ABSTRACT

Disclosed is a transceiver including a sub-sampling based frequency synthesizer with a sampling frequency $f_{smp}$, configured to generate M different output signals 3 for use as a carrier signal for transmission and/or a signal with a channel frequency for reception. M is an integer greater than 4, each output signal has a corresponding predefined frequency. The predefined frequencies are within a frequency band with a predefined bandwidth CFR. CFR is greater than $f_{smp}$. The frequency synthesizer includes a frequency shift unit configured for shifting a version of the output signal over a predefined frequency shift $f_{shift}$ to obtain a frequency shifted signal which is supplied to a sampling unit of the sub-sampling based frequency synthesizer, wherein $-f_{smp}/2 \le f_{shift} \le +f_{smp}/2$. The frequency shift unit is configured to use for the generation of each of the N different output signals a corresponding predefined frequency shift $f_{shift}$.

24 Claims, 5 Drawing Sheets

(56) References Cited

U.S. PATENT DOCUMENTS

| | | |
|---|---|---|
| 7,279,988 B1 * 10/2007 | Janesch et al. | 331/10 |
| 7,411,461 B2 * 8/2008 | Siddall | 331/1 R |
| 7,787,513 B2 * 8/2010 | Siwiak et al. | 375/130 |
| 2005/0117664 A1 * 6/2005 | Adan et al. | 375/316 |
| 2008/0024231 A1 * 1/2008 | Chang et al. | 331/38 |
| 2010/0207693 A1 * 8/2010 | Fagg | 331/10 |

OTHER PUBLICATIONS

International Search Report, dated Oct. 18, 2011, from corresponding PCT application.

* cited by examiner

Fig 1
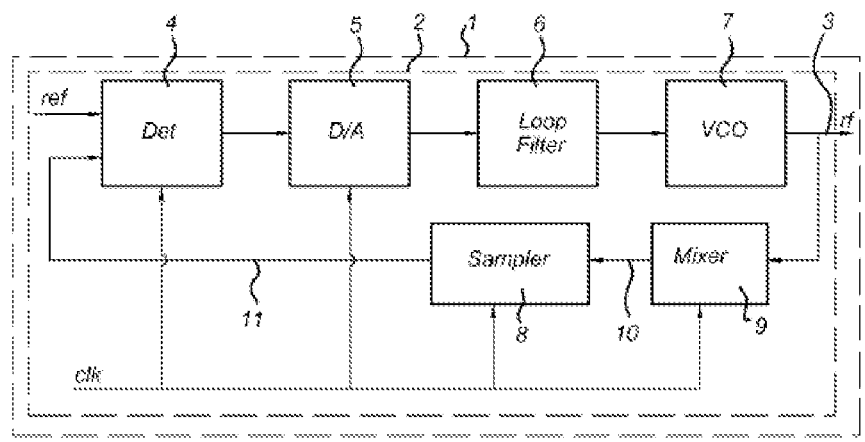
Fig 2           Related Art
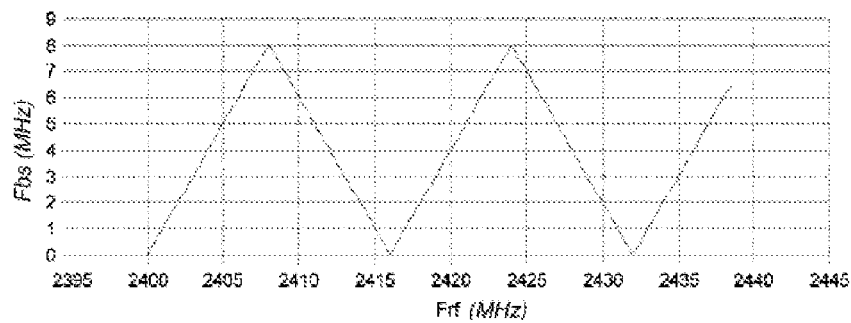

TRANSCEIVER WITH SUB-SAMPLING BASED FREQUENCY SYNTHESIZER

TECHNICAL FIELD OF THE INVENTION

The invention relates to a transceiver, more particular to a transceiver with low power consumption, more particular to an IEEE 802.15.4 transceiver. The invention further relates to frequency synthesizer for use in a transceiver, more particular a frequency synthesizer with low power consumption, more particular to a frequency synthesizer for use in an IEEE 802.15.4 transceiver.

BACKGROUND OF THE INVENTION

Frequency synthesizers utilized in known radio frequency (RF) communication devices, such as a RF transmitter, have included a voltage controlled oscillator and a reference oscillator coupled together in a phase locked loop. A voltage-controlled oscillator or VCO is an electronic oscillator designed to be controlled in oscillation frequency by a voltage supplied to a control input. The frequency of oscillation $f_{VCO}$ depends on the applied DC voltage. The VCO frequency is divided by a 1/N divider to a frequency comparable to a reference frequency $f_{ref}$. A phase detector PD compares the phase of the reference frequency with the phase of the divided VCO frequency out of the 1/N divider. A phase difference will result in a phase error signal on the output of the phase detector. Usually this error signal is either a positive or negative current pulse with a duration equal to the difference in phase, wherein the direction of the current depends on the direction of the error. The translation of the phase error into a current is performed inside the phase detector PD. This translation is done with a charge pump, named so as to indicate that charge is pumped into the loop filter. The loop filter low-pass filters the current representing the phase error so as to obtain an averaged phase error which is fed back to the control input of the VCO. The loop is a negative feedback loop. If the VCO frequency drifts, the error signal will increase/decrease driving the VCO frequency in the opposite direction so as to reduce the error. Thus, the VCO output is locked to the reference frequency at the other input of the phase detector PD.

A 2.2 GHz low jitter sub-sampling based PLL is disclosed in "A Low Noise Sub-Sampling PLL in Which Divider Noise is Eliminated and PD/CP Noise is Not Multiplied by $N^2$", IEEE JOURNAL OF SOLID-STATE CIRCUITS, VOL. 44, NO. 12, DECEMBER 2009. The proposed sub-sampled PLL comprises to ensure correct locking of the PLL, an additional frequency-locked loop. The FLL consists of a divide by-N and a three-state PFD/CP as in a classical PLL, which is not a sub-sampled PLL.

U.S. Pat. No. 5,444,420 describes a synthesizer having a PLL with a partial analog and partial digital control back loop and with a frequency divider and sub-sampling.

US Patent application 2010/207693 A1 describes a synthesizer having a PLL with a divide-by-N feedback loop and a frequency fine tuning loop.

US Patent application 2005/0117664 A1 describes a frequency conversion circuit with a down-conversion and a Hartley demodulator to provide baseband I-signal and Q-signal.

The difference between a sub-sampling synthesizer and a commonly used synthesizer architecture is that a sampler with a sampling frequency which is much lower than the RF frequency is used to obtain information on the frequency and phase of the carrier instead of a divider. A major advantage of the sampling architecture is that the power consumption can be low, because a low-frequency sampler is (much) less power hungry than a high-frequency divider. This makes the sub-sampling architecture attractive for low-power synthesizers.

Another advantage of the sub-sampling architecture is that the division operation in a traditional synthesizer adds in-band noise, proportional to $N^2$, wherein N is the division factor of the RF signal. Especially for high-frequency synthesizers this noise deteriorates the spectral purity of the LO signal. With a sub-sampling based architecture, better phase noise performance can be obtained.

The two mentioned advantages of the sub-sampling based architecture make it likely that it will be used more and more in future synthesizer designs.

However a disadvantage to this sub-sampling based architecture is that for generating some output frequencies sub-sampling does not work. This depends on the type of locking that is used: frequency-locking or phase-locking. If a frequency-locked loop (FLL) is used, the sampler does not work at exact integer multiples of the sampling-frequency. If phase-locked loop (PLL) is used, the architecture only works at the exact integer frequencies of the sampling-frequency.

Normally the sampling frequency is fixed. For generating only one RF output signal, one skilled in the art has to select a suitable sampling frequency. However, normally a transceiver has to operate at a multitude of channels and thus has to be able to generate a multitude of RF output signals. For a PLL design, this means that all frequencies of the RF signal to be generated must be a multiple of the sampling frequency. For a FLL design, this means that all frequencies to be generated by the frequency synthesizer must be at a minimal distance from any multiple of the sampling frequency.

Using different sampling frequencies for generating different RF output signals is not suitable in view of design requirements such as EMC.

Here is an example to illustrate the operation and practical problems of a subsampler that operates in the 2.4 GHz band. The RF-signal that is to be sampled has a frequency of Frf and is sampled with a clock with frequency $f_{smp}$. $f_{smp}$ is much smaller than Frf. The frequency Fout of the subsampled RF signal is then:

$$Fout = |Frf - f_{smp} * \text{round}(Frf/f_{smp})|$$

The transfer function from Frf to Fout for a certain frequency-range in the 2.4 GHz band with a sampling frequency of 16 MHz, has been depicted in FIG. 2. The sub-sampler is part of the control loop of the frequency synthesizer. The VCO RF output signal is controlled digitally and therefore requires a sampler to convert the RF frequency to a digital format.

For fast frequency measurement and to remain in a linear transfer region of the function Fout(Frf), Fout should be in a certain range to combine accuracy and acquisition time. From FIG. 2 it can be observed that around frequencies 2400, 2416 and 2432 MHz, etc, the RF frequency is converted to 0 MHz. Low frequencies makes it impossible to perform fast frequency-measurement/phase-measurement and thus to have a fast loop behavior. Furthermore, around multiples of the sampling frequency, i.e. 2400, 2408, 2416, 2424 MHz, etc, the function Fout(Frf) is not differentiable, i.e. a control signal derivable from Fout could not be used to obtain a stable loop behavior so it is hard to build a control-loop with such a transfer-function. Starting at a RF signal with a RF frequency which is a multiple of the sampling frequency, in both cases a) increase or b) decrease of the RF signal frequency, the frequency of the sub-sampled signal Fout will change in the same direction.

SUMMARY OF THE INVENTION

The object of the invention is to provide an improved transceiver, with respect to at least one of the problems described above. The object of the invention is further to provide a novel frequency synthesizer which is optimal with respect to at least one of: power consumption, chip-area, improved spectral purity of the synthesizer output signal.

According to the invention, this object is achieved by a transceiver having the claimed features. Advantageous embodiments and further ways of carrying out the invention may be attained by the measure mentioned in the dependent claims.

According to the invention, a transceiver comprises a frequency synthesizer configured to generate M different output signals for use as a carrier signal for transmission and/or a signal with a channel frequency for reception, wherein M is an integer greater than 4, each output signal has a corresponding predefined frequency, and the predefined frequencies are within a channel frequency range with a predefined width CFR, wherein the frequency synthesizer is a sub-sampling based frequency synthesizer with a sampling frequency $f_{smp}$, wherein CFR is greater than $f_{smp}$, and is characterized in that the frequency synthesizer comprises a frequency shift unit configured for shifting a version of the output signal over a predefined frequency shift $f_{shift}$ to obtain a frequency shifted signal which is supplied to a sampling unit of the sub-sampling based frequency synthesizer, wherein $-f_{smp}/2 \leq f_{shift} \leq +f_{smp}/2$ and the frequency shift unit is configured to use for the generation of each of the N different output signals a corresponding predefined frequency shift $f_{shift}$.

The present invention is based on the need to have only one sampling frequency and the possibility to generate a multitude of different output frequencies with a sub-sampled frequency synthesizer. To overcome the sub-sampling problems with a sub-sampling based FLL, the afore-mentioned problems of sub-sampling of signals having a frequency around multiples of the sampling frequency, one skilled in the art could choose a sampling frequency which is higher than the channel frequency-range of the transceiver. For IEEE 802.15.4 2.4 GHz, the channel frequency-range is about 80 MHz. 80 MHz is still a relative high sampling frequency. To be able to use a lower sampling frequency, one skilled in the art has to provide a solution that the sampled RF signal could not have a frequency which is a multiple of the sampling frequency. The solution has been found in providing a frequency shift of the RF signal wherein the frequency shift depends on the desired RF signal to be generated such that the frequency of the signal to be sampled is at a minimal distance from any multiple of the sampling frequency. In this case, the control signal derived by a frequency detector or phase/frequency detector is suitable to control the loop of the synthesizer.

According to an embodiment of the invention, the sub-sampling based frequency synthesizer is a sub-sampling based frequency locked loop frequency synthesizer. Applying the invention in a sub-sampling based frequency locked loop frequency synthesizer as disclosed in co-pending non-published international patent application PCT/NL2010/050150, filed 24 Mar. 2010 improves the characteristics of said synthesizer further.

In an embodiment of the invention, the sampling frequency $f_{smp}$ is a multiple of $f_{shift}$. This feature allows to derive easily a mixing signal to shift the frequency of the output signal from the sampling clock signal.

In a further embodiment, $f_{smp} = 2^x \times f_{shift}$, wherein x is an integer greater than 0. This feature allows to obtain the mixing signal by one or more time dividing the sampling signal by a factor two.

In an embodiment of the invention, the sampler is a binary sampler. Using a binary sampler allows to reduce the power consumption further.

In an embodiment of the invention, the frequency shift unit is single side band modulator. More particularly the frequency shift unit is based on a Hartley modulator. In the digital domain quadrature phase mixing signals could easily be derived from the sampling clock signal. This makes it advantageous to use a Hartley based modulator. This embodiment implies that the version of the output signal is in the form of single ended or balanced quadrature phase signals.

In a further embodiment of the invention, the frequency shift unit comprises input terminals to receive the quadrature phase signals, one or two output terminals, and between any combination of input terminal and output terminal a switch to couple an input terminal to an output terminal, wherein the frequency shift unit further comprises a control signal generation unit configured for generating control signals to control the switches. These features provide a very simple mixing structure with low power consumption and which uses a small chip area. In this embodiment, the control signals generator is a kind of Low Frequency Local Oscillator to generate control signals in the form of quadrature phase signals.

In a further embodiment of the invention, the switches have switching instants which differ from switching instants of switches of the sampling unit. These features enables that at the sampling instants the signal(s) at the input of the sampling unit are stable and thus provides a reliable sampling value, at its output. In a preferable embodiment of the invention, the sampling instants of the sampling unit be in response to a positive edge of a sampling clock signal and the switching instants of the switches be in response to a negative edge of the sampling clock signal. In this way, the switching instants and sampling instants are synchronized and well defined with respect to each other.

In an embodiment of the invention, the transceiver is configured to operate in a multitude of channel states, wherein each channel state has a corresponding transmission and receiving frequency generated by the frequency synthesizer, characterized in that the predefined frequency shift $f_{shift}$, the frequency of the frequency shifted output signal $f_{mix,t}$ when generating the transmission frequency and the frequency of the shifted output signal $f_{mix,r}$ when generating the receiving frequency applies to the following equation: $(f_{smp}/2) \times \text{truncate}(f_{mix,t}/f_{smp}/2) < f_{mix,r} < (f_{smp}/2) \times (1 + \text{truncate}(f_{mix,t}/f_{smp}/2))$. These features provide a control loop which does not need any further changes in the loop when changing between transmission mode and receiving mode within a channel.

The low-power characteristic of the frequency synthesizer according to the invention enables designers to use the invention in low-power digital radios, such as IEEE 802.15.4 transceivers or ZigBee devices.

It should be noted that co-pending non-published international patent application PCT/NL2010/050150, filed 24 Mar. 2010 described a sub-sampled FLL. However, said sub-sampled FLL does not include a frequency shift unit to shift the frequency of the signal prior to sampling to overcome the disadvantages described before.

It will be clear that the various aspects mentioned in this patent application may be combined and may each be considered separately for a divisional patent application. Other features and advantages of the invention will become apparent from the following detailed description, taken in conjunction with the accompanying drawings which illustrate, by way of example, various features of preferred embodiments of the invention.

BRIEF DESCRIPTION OF THE FIGURES

These and other aspects, properties and advantages of the invention will be explained hereinafter based on the following description with reference to the drawings, wherein like reference numerals denote like or comparable parts, and in which:

FIG. 1 shows a block diagram of a frequency synthesizer according to the invention;

FIG. 2 illustrates in a graph the frequency conversion performed by sub-sampling;

DESCRIPTION OF EMBODIMENTS

Figure 3:
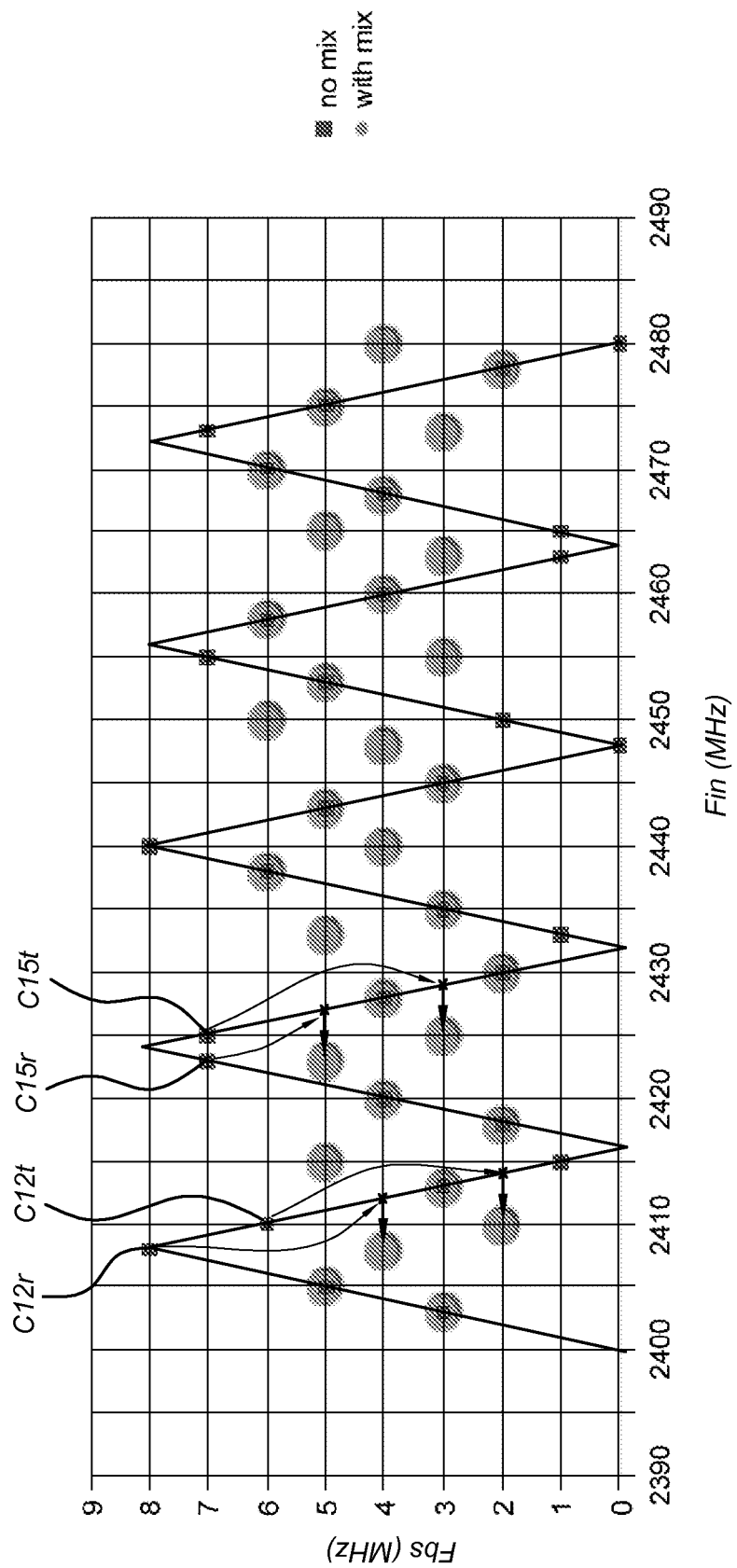
FIG. 3 illustrates in a graph the frequency conversion performed by a combination of frequency shifting and sub-sampling.

According to the invention and the following description the term "sub-sampling based" means that the output signal 3 of the frequency synthesizer having a frequency $f_{out}$ is sampled with a sampling unit with a sampling frequency $f_{smp}$ to obtain a time discrete signal, wherein $f_{smp} \ll f_{out}$. By sub-sampling or under-sampling the frequency $f_{out}$ is mapped to a frequency $f_{bs}$ in the range from $-f_{smp}/2$ to $+f_{smp}/2$. By sub-sampling, the power consuming frequency division unit or counters counting the zero crossings or cycles in the output signal of the frequency synthesizer are replaced by a sampler which consumes considerably less energy. For an IEEE 802.15.4 transceiver $f_{out}$ has a frequency in the range of the 2.4 GHz band. In the embodiment described below a sampling frequency of 16 MHz is used.

FIG. 1 shows a block diagram of a frequency synthesizer 2 of a transceiver 1 according to the invention. The frequency synthesizer comprises a feedback loop with the following components: a frequency or phase detection unit 4, a digital-to-analog convertor 5, a loop filter unit 6, a voltage controlled oscillator unit 7, a frequency shift unit 9 and a sampling unit 8.

In case of a sub-sampling based phase locked loop (PLL) frequency synthesizer, the detection unit 4 is a phase detection unit. The phase detection unit 4 comprises a first input for receiving a reference frequency signal $f_{ref}$ and a second input for receiving a variable frequency signal. The phase detection unit 4 could be in the form of any suitable phase detector circuitry. The sampling unit 8 samples the signal at the input to obtain a multi-bit output signal, for example an 8-bit signal. A multi-bit output signal is necessary to have phase information available in the signal. The phase detection unit 4 is configured to generate a phase difference output signal which is a function of a difference in phase between the signals supplied to its inputs. This phase difference signal is converted to an analog signal and which is filtered by the loop filter to obtain the signal to control the VCO unit 7.

In case of a sub-sampling based frequency locked loop (FLL) frequency synthesizer, the frequency detector unit 4 comprises a first input for receiving a reference frequency signal $f_{ref}$ and a second input for receiving a variable frequency signal. The frequency detector unit 4 is configured to generate a frequency difference output signal which is a function of a difference between a frequency value associated with the reference frequency signal $f_{ref}$ and a frequency value associated with the variable frequency signal. The frequency difference output signal is an error signal indicating the frequency offset of the sub-sampled output signal of the frequency synthesizer from the desired reference frequency indicated by the signal $f_{ref}$. The digital-to-analog convertor 5 is configured to convert the frequency difference signal in to an analog frequency difference signal. In an embodiment the digital-to-analog convertor 5 comprises a Delta Sigma Modulator (DSM) to convert the frequency difference output signal, which is a signal in the digital domain, in to an analog frequency difference signal. The digital-to-analog convertor is in an embodiment arranged to convert digital signal received at its input into a current at its output. In this embodiment de DSM comprises a charge pump so that a charge can be pumped into the loop filter unit 6.

The loop filter unit 6 is configured to receive the analog frequency difference output signal to provide a smoothed control signal. The loop filter unit 6 comprises electronic components such as resistors, capacitors and is configured to attenuate any signal component above a predetermined frequency. In this way, the loop filter 'averages' the analog frequency difference signal by removing high frequency components and feeds the result to the control input of the voltage controlled oscillator (VCO) unit 7. Signal components with a frequency higher than the loop filter cut-off frequency which are provided to the control input of the VCO unit 7 will be treated as frequency noise components at the output of the VCO unit 7. According to the present invention the loop filter unit 6 is preferably a $2^{nd}$ order loop filter with an out-of-band attenuation with a roll-off of 12 dB per octave.

The voltage controlled oscillator unit 7 configured to receive the smoothed control signal and to produce an output signal which frequency is a function of the smoothed control signal.

The output signal of the VCO unit 7 is supplied to mixer unit 9. The mixer unit 9 performs a frequency shift on the output signal of the VCO unit 7 and supplies a frequency shifted signal to its output. The sampling unit 8 is configured to under-sample the output signal from mixer unit 9 with a predetermined sampling frequency $f_{smp}$ to obtain the variable frequency signal that is applied to the frequency detector unit 4, wherein the variable frequency signal is a P-bit digital signal, P being a positive integer smaller than 8. In the following description P=1. In said case the sampling unit 8 is a binary sampler and the variable frequency signal is a binary signal with a frequency that can be calculated with the following formula: $F_{bs}=F_{VCO}-f_{smp} \times \text{round}(F_{VCO}/f_{smp})$, where $F_{bs}$ is frequency of binary signal, $F_{VCO}$ is frequency of output signal and round(x) rounds x to the nearest integer value.

FIG. 2 illustrates the frequency conversion performed by the sampling unit 8. The sampling frequency $f_{smp}$ is 16 MHz. The frequency of the under-sample signal at the output of the sampling unit 8 zigzags between 0 and 8 MHz when changing the frequency of the signal at the input of the sampling unit 8 from 2400 MHz-2480 MHz.

FIG. 3 shows the same characteristic as in FIG. 2 but now the channel frequencies for IEEE 802.15.4 2.4 GHz channels for both transmission and reception are projected on the zigzag line. It can be seen that there are some channel frequencies that are present on the tips of the zigzag line, i.e. the frequencies at 2408 MHz, 2440 MHz, 2448 MHz and 2480 MHz. For fast frequency measurement and to remain in a linear transfer region of the function $f_{bs}(F_{VCO})$, the frequency of the subsampled signal should be in a certain range to combine both accuracy and acquisition time. In that case a frequency-conversion is necessary for certain input-frequencies prior to sampling to convert the signal at the input of the sampling unit to a signal with a frequency that is at distance from 0 MHz and 8 MHz, i.e. at distance from the non-linear parts of the frequency conversion.

Around frequencies 2400, 2416, 2432, ... MHz it would be impossible to do fast frequency-measurement and around 2400, 2408, 2416, ... MHz the function $F_{bs}(F_{VCO})$ is not differentiable so it is hard to build a control-loop with such a transfer-function.

To provide enough room for frequency variations at the input of the sampling unit, the absolute subsampler output frequency $F_{bs}$ has to be larger or equal to 2 MHz and smaller than or equal to 6 MHz in order to be processed accurately. This means that there needs to be a frequency-shift for certain frequencies in order to have a valid range for the next processing stage which is the sampler. Table 1 shows a possible solution for the IEEE 802.15.4 2.4 GHz channel frequencies for both reception mode RX based on a 2 MHz IF and transmission mode TX with direct modulation. Column 'OUT no mix' shows the output frequency in case no mixing is used. Column F_LO shows the LO frequency used for mixing and column 'OUT with mix' shows the output frequency with mixer.

TABLE 1

| IEEE channel | mode | Frf [MHz] | OUT no mix [MHz] | F_LO [MHz] | mix IF [MHz] | OUT with mix [MHz] |
|---|---|---|---|---|---|---|
| 11 | rx | 2403 | 3 | 0 | 2403 | 3 |
|  | tx | 2405 | 5 | 0 | 2405 | 5 |
| 12 | rx | 2408 | 8 | 4 | 2412 | 4 |
|  | tx | 2410 | 6 | 4 | 2414 | 2 |
| 13 | rx | 2413 | 3 | 0 | 2413 | 3 |
|  | tx | 2415 | 1 | −4 | 2411 | 5 |
| 14 | rx | 2418 | 2 | 0 | 2418 | 2 |
|  | tx | 2420 | 4 | 0 | 2420 | 4 |
| 15 | rx | 2423 | 7 | 4 | 2427 | 5 |
|  | tx | 2425 | 7 | 4 | 2429 | 3 |
| 16 | rx | 2428 | 4 | 0 | 2428 | 4 |
|  | tx | 2430 | 2 | 0 | 2430 | 2 |
| 17 | rx | 2433 | 1 | 4 | 2437 | 5 |
|  | tx | 2435 | 3 | 0 | 2435 | 3 |
| 18 | rx | 2438 | 6 | 4 | 2442 | 6 |
|  | tx | 2440 | 8 | 4 | 2444 | 4 |
| 19 | rx | 2443 | 5 | 0 | 2443 | 5 |
|  | tx | 2445 | 3 | 0 | 2445 | 3 |
| 20 | rx | 2448 | 0 | 4 | 2452 | 4 |
|  | tx | 2450 | 2 | 4 | 2454 | 6 |
| 21 | rx | 2453 | 5 | 0 | 2453 | 5 |
|  | tx | 2455 | 7 | −4 | 2451 | 3 |
| 22 | rx | 2458 | 6 | 0 | 2458 | 6 |
|  | tx | 2460 | 4 | 0 | 2460 | 4 |
| 23 | rx | 2463 | 1 | 4 | 2467 | 3 |
|  | tx | 2465 | 1 | 4 | 2469 | 5 |
| 24 | rx | 2468 | 4 | 0 | 2468 | 4 |
|  | tx | 2470 | 6 | 0 | 2470 | 6 |
| 25 | rx | 2473 | 7 | 4 | 2477 | 3 |
|  | tx | 2475 | 5 | 0 | 2475 | 5 |
| 26 | rx | 2478 | 2 | 4 | 2482 | 2 |
|  | tx | 2480 | 0 | 4 | 2484 | 4 |

FIG. 3 shows the results of table 1 graphically. Shown is the zigzag characteristic illustrating the effect of under sampling a signal with a given input frequency $f_{in}$ and the corresponding output frequency $f_{bs}$. The channel frequencies are indicated by the squares (no mix) and the corresponding output frequency with frequency shift are indicated by circles (with mix). According to table 1, the used frequency shift depends on the input frequency $f_{in}$ of the channel frequency. Channel frequencies that will be converted by the under-sampling to signal with a frequency in the range of 2-6 MHz do not have to be shifted prior to sampling. Channel frequencies that will be converted to a signal with a frequency that is below 2 MHz or above 6 MHz are frequency shifted by −4 MHz or +4 MHz. In FIG. 3 the process of the frequency shift is illustrated in more detail for four IEEE channel frequencies c12r, c12t, c15r and c15t.

For IEEE channel 12 receiving mode the frequency of the signal at the output of the frequency synthesizer is 2408 MHz. After down-sampling this signal with a 16 MHz sampling clock, a signal with a frequency of 8 Mhz will be obtained. As there is always some noise in the signal, the frequency will vary around 2408 MHz. If the frequency decreases, the frequency after sampling decreases. If the frequency increases, the frequency after sampling also decreases. Consequently, the deviation in frequency after sampling does not provide information whether the frequency is lower or higher than the desired frequency and could therefore not be used as control signal to control the loop of the frequency synthesizer. To overcome this problem, according to the invention the 2408 MHz signal is shifted over +4 MHz. Now a signal with a frequency of 2412 MHz is supplied to the input of the sampling unit. This intermediate frequency is indicated in FIG. 3 with an X. After sub-sampling with 16 MHz a signal with a frequency of 4 MHz will be obtained. The result of frequency shift and under-sampling is indicated by the circle below square c12r. Similarly, IEEE channel 12 transmission mode with a frequency of 2410 MHz, indicated by square c12t, is shifted with +4 MHz to an intermediate signal with a frequency of 2414 MHz, which results in a signal with a frequency of 2 MHz after under-sampling.

In the same way, the IEEE channel 15 receiving mode and transmission frequencies, squares c15r, c15t, of 2423 and 2425 MHz are shifted by +4 MHz prior to sub-sampling and after sub-sampling have a frequency of 5 and 3 MHz, respectively.

The frequency shifts have been chosen such that for both transmission mode and receiving mode, the derivative of the sampler output frequency Fbs as function of input frequency after sub-sampling has the same sign in both transmission mode and receiving mode. This has the advantage, that when switching between transmission mode and receiving mode no correction is necessary to have a correct sign of the loop gain. The derivative of the frequency for both the transmission frequency and the receiving frequency has the same sign if the frequency of the signal supplied to the sampling unit complies with the following equation:

$$(f_{smp}/2) \times \text{truncate}(f_{mix,r}/f_{smp}/2) < f_{mix,r} < (f_{smp}/2) \times (1 + \text{truncate}(f_{mix,r}/f_{smp}/2))$$

wherein $f_{smp}$ is the sampling frequency, $f_{mix,t}$ is the frequency of the selected IEEE channel transmission mode after the desired frequency shift, $f_{mix,r}$ is the frequency of the selected IEEE channel receiving mode after the desired frequency shift and truncate is a function which truncates a value to an integer value.

It should be noted that instead of a frequency shift of +4 MHz prior to sub-sampling the 2423 MHz and 2425 MHz of IEEE channel 15 frequencies, a frequency shift of −4 MHz could be used.

Figure 4:
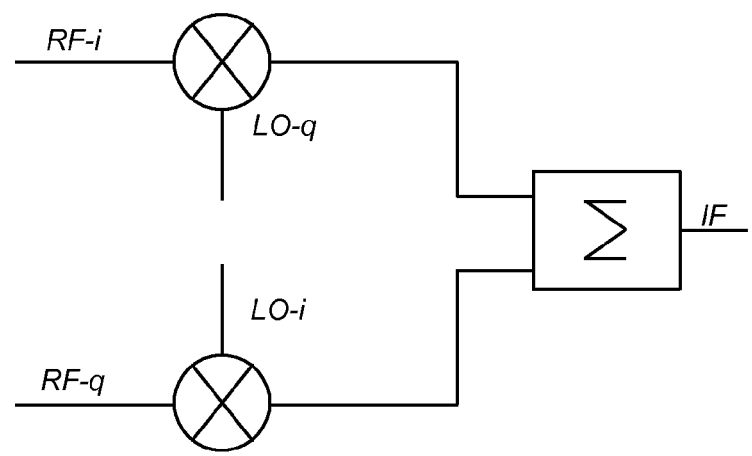
FIG. 4 shows a block diagram of a known Hartley modulator.

The necessary frequency shift or conversion action could be implemented with single side band (SSB) such as the well-known Hartley modulator. FIG. 4 shows the architecture of a Hartley modulator. The Hartley modulator receives a quadrature phase signal RF-i, RF-q at its input. The quadrature phase input signal is mixed with a quadrature local oscillator signal LO-q, LO-i. The frequency of the quadrature local oscillator (LO) signal corresponds to the desired frequency shift. The RF-i signal is mixed with the LO-q signal and the RF-q signal is mixed with the LO-i signal. Subsequently both mixed signals are combined by means of an adding function to obtain a frequency shifted signal which is shifted version of the original RF signal shifted over the LO frequency. This embodiment has the disadvantage of increased costs due to component count and reduced performance in terms of current-consumption and LO leakage.

Figure 5:
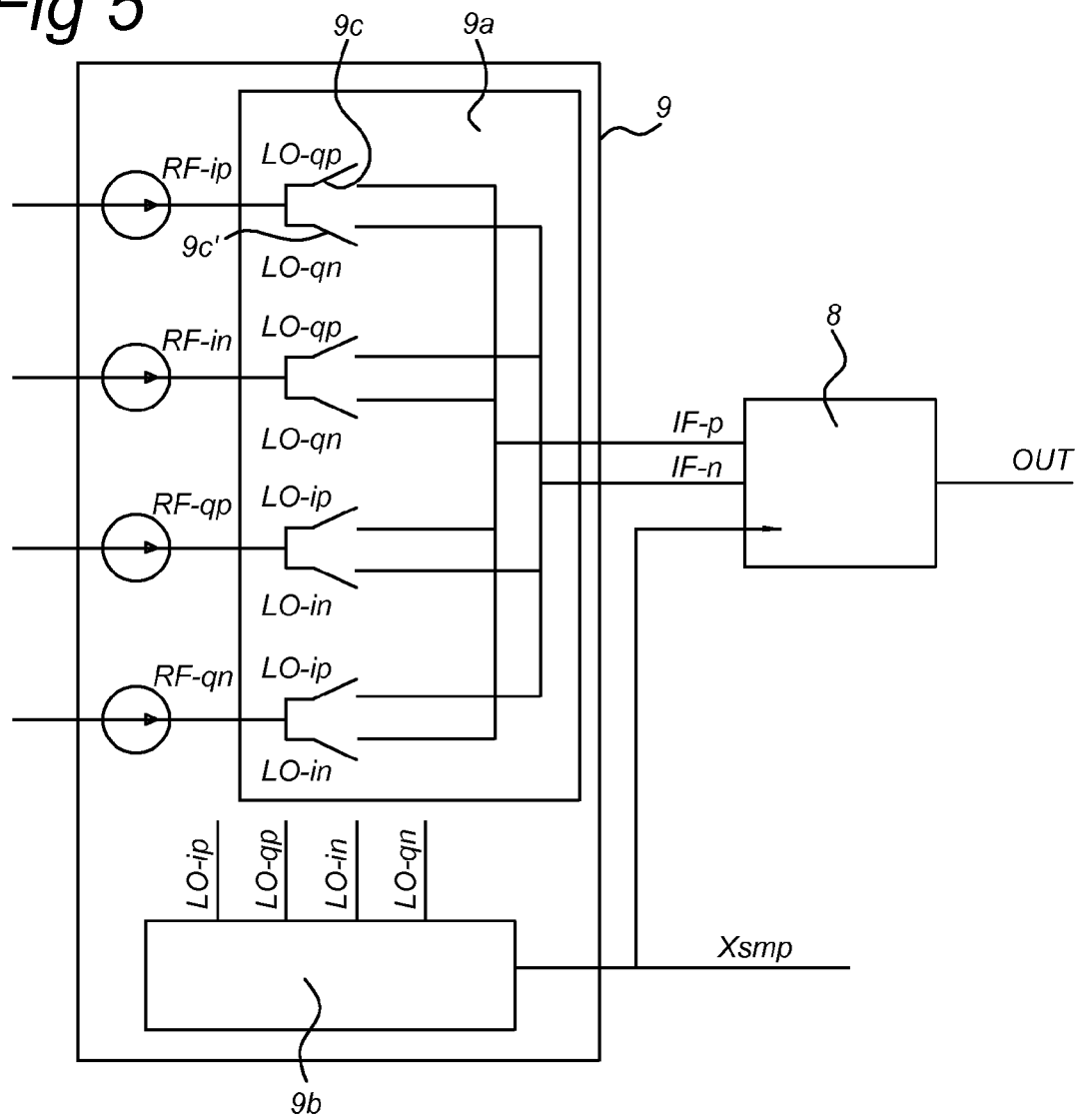
FIG. 5 shows a block diagram of a shifting unit and sampling unit according to a balanced embodiment the invention.

FIG. 5 shows an embodiment of the invention wherein a binary sub-sampler 8 is coupled to the output of a frequency shift unit 9 which is based on a Hartley modulator architecture. In this embodiment, the frequency-conversion or frequency shift is accomplished by a switching mixer 9a. This switching mixer 9a is driven by a set of low-frequency (LF) LO control signals which are generated by a LF LO control generator 9b. The LF LO control generator 9b derived its LO control signals from the sampling clock signal $X_{smp}$ with a sampling frequency $f_{smp}$. By means of a counter, easily LO control signals could be generated with a frequency which is ½, ¼ or ⅛ of the sampling frequency. With a sampling frequency of 16 MHz, easily a frequency shift of −4 MHz, −2 MHz, −1 MHz, 0 MHz, +1 MHz, 2 MHz and 4 MHz could be realised. The LO control signals are synchronized to the sampling-clock in such a way that the edges of the LO control signals never coincides with the sampling moment of the binary sampler 8. This could be done by having the sampling moments be responsive to the falling edge of the sampling clock signal $X_{smp}$ and having a change in the LO control signals responsive to a rising edge of the sampling clock signal. In another embodiment, the sampling moments are responsive to the rising edge of the sampling clock signal $X_{smp}$ and have a change in the LO control signals responsive to a falling edge of the sampling clock signal. In this way, the signals at the output of the frequency shift unit 9 are stable when the sampling unit 8 samples the signal.

The embodiment in FIG. 5 is a balanced embodiment. The binary sub-sampling unit 8 with a frequency-shift unit 9 consists of:
 a RF mixer 9a consisting of 8 single-pole single throw switches 9c, 9c' which connects the 4 balanced quadrature phase RF signals RF-ip, RF-in, RF-qp and RF-qn to a binary sampling unit 8. The switches are controlled by balanced quadrature LF LO signals LO-ip, LO-qp, LO-in and LO-qn which are generated by:
 a LF LO-generator (9b) which generates 4 quadrature LO signals with frequency F_LO (for instance 4 MHz) from a clock signal $X_{smp}$ with frequency $f_{smp}$ (for instance 16 MHz).
 a binary sampler (8) which converts the RF mixer output signals IF_p and IF_n into a bit-stream.

The LF LO signals generated by (9b) are synchronized to the sampling-clock $X_{smp}$ in such a way that the mixer switching moment never coincides with the sampling moment, for instance by sampling at the positive edge of $X_{smp}$ while switching the mixer at negative edges of $X_{smp}$. Synchronization of the switching moments and the sampling moment avoids any LO leakage into the sampler. Furthermore, it will not be possible that a sample will become invalid in case the mixer switches at the sampling moment.

The frequency shift unit 9 has a structure which corresponds to a Hartley modulator scheme. A difference with existing systems is that the LF LO signal is derived from the sampling clock signal $X_{smp}$. The LF LO signal is synchronized to the sampling clock such that the frequency of the LO signal is $f_{shift}=f_{smp}/K$ in which K is an integer and depends on the desired RF signal generated by the frequency synthesizer.

The mixer is implemented with switches to perform the mixing function. This has the advantage of reduced required chip-area in case of an integrated circuit implementation.

In stead of 8 single-pole single throw switches, 4 single-pole double throw could be used. This allows to reduce the number of quadrature LO signals to two signals.

In another embodiment, the switches are replaced by switched current-sources.

Figure 6:
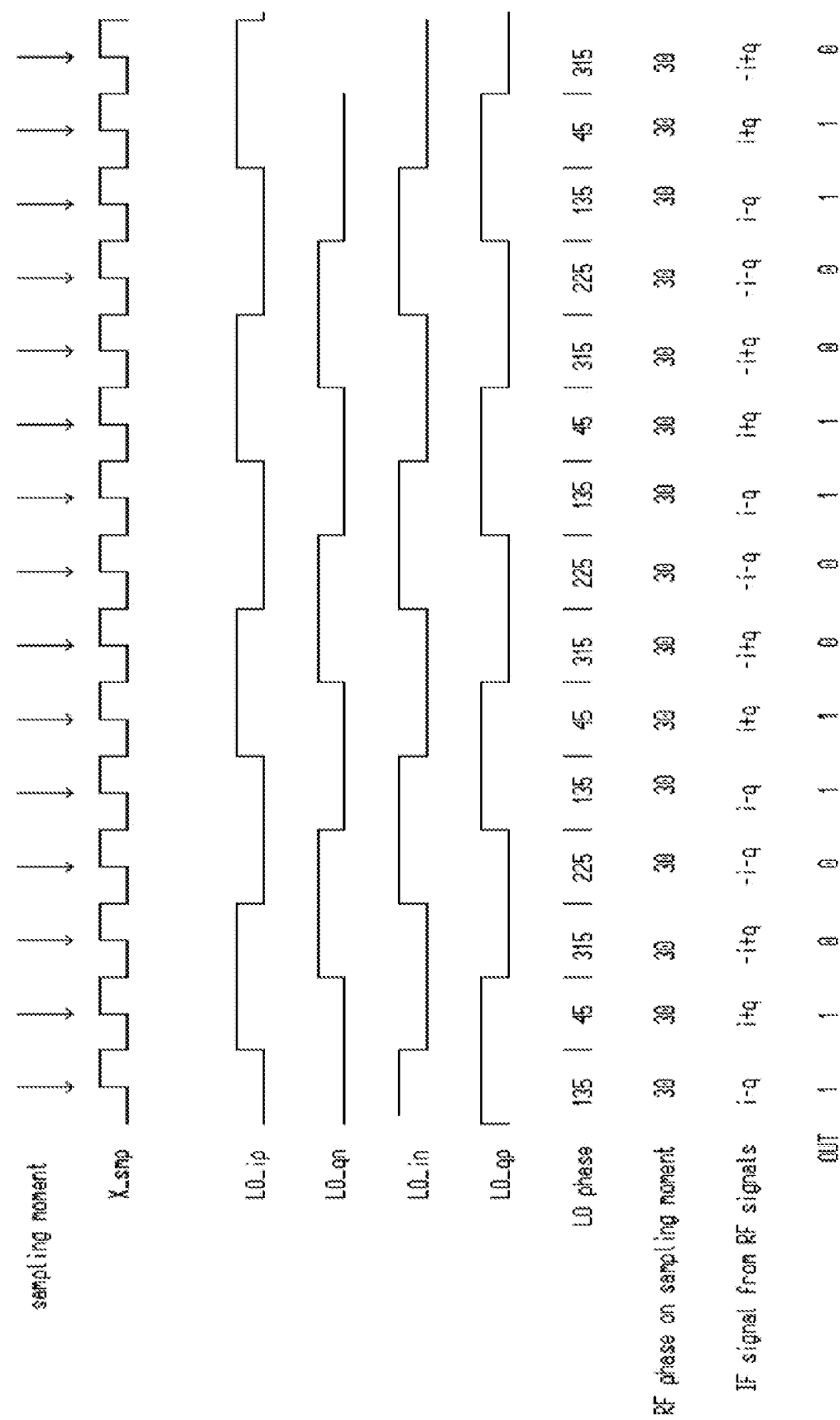
FIG. 6 illustrates signals used in embodiment shown in FIG. 5.

The operation of the circuit in FIG. 5 is demonstrated in FIG. 6. The signals shown in FIG. 6 could be found with a corresponding reference in the block diagram shown in FIG. 5.

In this example of operation, the frequency of the RF signal, Frf, is an exact multiple of the sampling signal Xsmp. This could for example be the IEEE channel 20 receiving mode frequency of 2448 MHz or the IEEE channel 26 transmission mode frequency of 2480 MHz. Furthermore, the phase of the RF-signal at the sampling moment (which is the positive edge of the clock) happens to be 30 degrees. Without mixing or mixing with a $f_{shift}=0$, the signal at the output of the binary sampler OUT will be constant. The LO frequency used for the frequency shift is: $f_{shift}=f_{smp}/4$.

In FIG. 6 are shown in time from above respectively, the sampling moments, the sampling clock signal $X_{smp}$, the four control signals generated by the LF LO generator unit 9b, LO_ip, LO_qn, LO_in and LO_qp that drive the switches 9c, 9c', the phase of the LO control signals at the sampling moment, the phase of the RF signal on sampling moment, the intermediate differential signal IF_p, IF_n after frequency shift at the input of the sampling unit and the bit stream signal OUT at the output of the sampling unit. It can be observed that the switching moments of the switches occur at the negative or falling edge of X_smp and the sampling moments occur at the positive or rising edge of X_smp.

The row 'IF signal from RF signals' shows how the differential IF signal IF_p−IF_n depends on the RF signals RF_ip, RF_in, RF_qp, RF_qn: due to the mixing action there are four possibilities:

$$IF=\pm RF\_i \pm RF\_q$$

In which: RF_i=RF_ip−RF_in and RF_q=RF_qp−RF_qn

At the every sampling moment in FIG. 6, RF_ip has the value +½sqrt(3), RF_in has the value −½sqrt(3), RF_qp has the value ½ and RF_qn has the value −½. At the first sampling moment LO_in and LO_qp are 1. Now IF_p=RF_ip+RF_qn=½sqrt(3)+−½=0.366 and IF_n=RF_in+RF_qp=−½sqrt(3)+½=−0.366 which results in a "1" at the output of the sampling unit. At the second sampling moment LO_ip and LO_qp are 1. Now IF_p=RF_ip+RF_qp=½sqrt(3)+½=1.366 and IF_n=RF_in +RF_qn=−½sqrt(3)+−½=−1.366, which results in a "1" at the output of the sampling unit. At the third sampling moment LO_ip and LO_qn are 1. Now IF_p=RF_in+RF_qp=−½sqrt(3)+½=−0.366 and IF_n=RF_in +RF_qn=½sqrt(3)+−½=+0.366, which results in a "0" at the output of the sampling unit. At the fourth sampling moment LO_in and LO_qp are 1. Now IF_p=RF_in+RF_qn=−½sqrt(3)+−½=−1.366 and IF_n=RF_ip+RF_qp=½sqrt(3)+½=1.366, which results in a "0" at the output of the sampling unit.

It can be observed that with the proposed circuit the output frequency of signal OUT at the output of the sampling unit is now 4 MHz due to the frequency shift action of the frequency shift unit 9. The frequency transfer function of $F_{rf}$ to $F_{out}$ is a linear function now. It should be noted that Fout corresponds to Fbs in FIG. 3. Linearity is important when applying the combination of a frequency shift unit and sampling unit in a control-loop of a frequency synthesizer.

Figure 7:
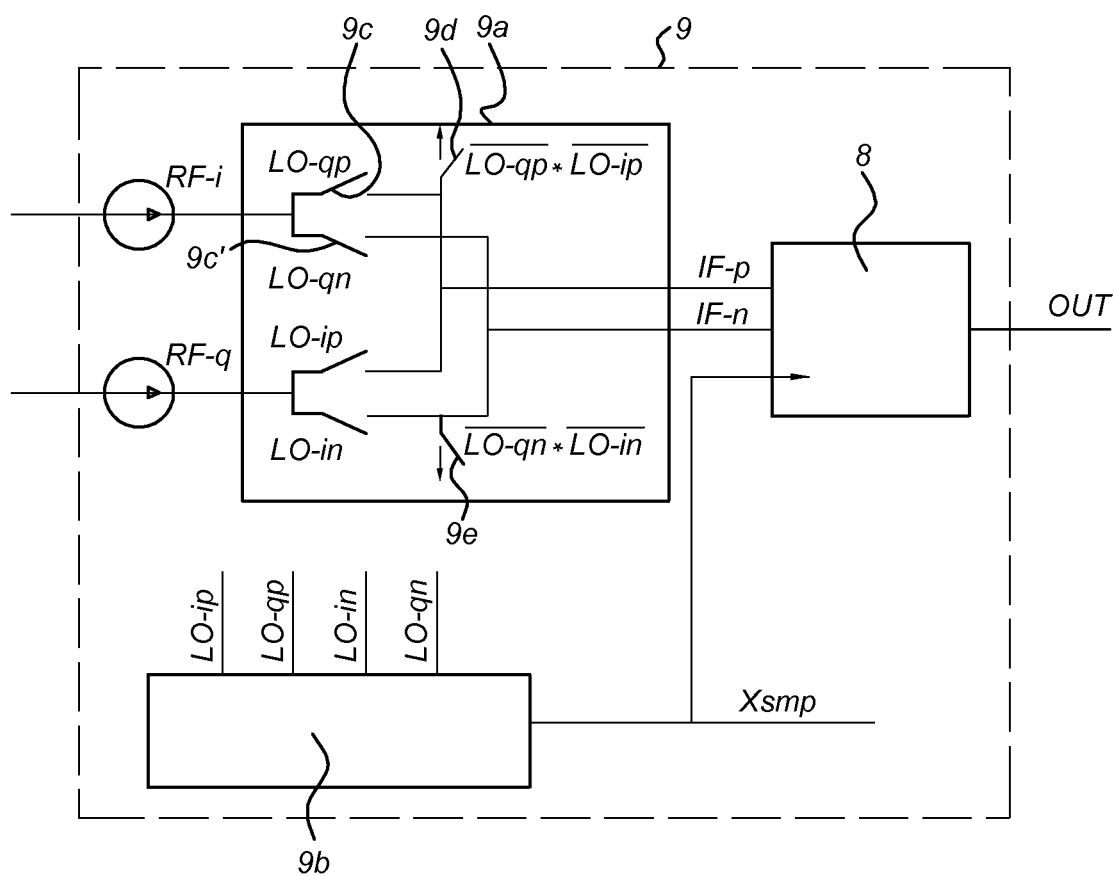
FIG. 7 shows a block diagram of a shifting unit and sampling unit according to a single-ended embodiment the invention.

FIG. 7 shows another embodiment of a combination of frequency shift unit and sampling unit. A single-ended quadrature phase RF-signal is supplied to the frequency shift unit 9 and a balanced frequency shifted signal IF-p, IF-n is supplied to the sampling unit 8. This embodiment comprises a switch 9d to the supply voltage and a switch 9e to ground. These switches ensure that the signals IF-p and IF-n will never be floating at the sampling moment.

The present invention provides a combination of a frequency shift unit 9 or mixing unit and sub-sampling unit 8 that allows to obtain a sub-sampling based locked loop with a closed loop response similar to a PLL but having improved settling time and improved suppression of high frequency components of the quantization noise due to the sampling process. The invention allows to obtain a frequency synthesizer with improved characteristics with respect to at least one of power consumption, locking characteristic, design optimization characteristics compared to non-sub-sampling PLL based frequency synthesizers. An application in which the invention could be used is to measure the frequency modulation-index of a Frequency Modulated signal.

The measures described hereinbefore for embodying the invention can obviously be carried out separately or in parallel or in a different combination or if appropriate be supplemented with further measures; it will in this case be desirable for the implementation to depend on the field of application of the transceiver. The invention is not limited to the illustrated embodiments. Changes can be made without departing from the idea of the invention. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A transceiver comprising
a frequency synthesizer configured to generate M different output signals for use as one or more of a carrier signal for transmission and a signal with a channel frequency for reception,
wherein M is an integer greater than 4, each output signal has a corresponding predefined frequency, and the predefined frequencies are within a frequency band with a predefined channel frequency-range (CFR),
wherein the frequency synthesizer is a sub-sampling based frequency synthesizer with a sampling frequency $f_{smp}$, wherein CFR is greater than $f_{smp}$, the frequency synthesizer comprising a frequency shift unit based on a Hartley modulator and configured for shifting a version of the output signal over a predefined frequency shift $f_{shift}$ to obtain a frequency shifted signal which is supplied to a sampling unit of the sub-sampling based frequency synthesizer,
wherein $-f_{smp}/2 \leq f_{shift} \leq f_{smp}/2$ and the frequency shift unit is configured to use for the generation of each of the M different output signals corresponding predefined frequency shift $f_{shift}$, wherein $f_{smp}$ is a multiple of $f_{shift}$.

2. The transceiver of claim 1, wherein the sub-sampling based frequency synthesizer is a sub-sampling based frequency locked loop frequency synthesizer.

3. The transceiver of claim 1, wherein $f_{smp}=2^x \times f_{shift}$, wherein x is an integer greater than 0.

4. The transceiver of claim 1, wherein the sampling unit is a binary sampler.

5. The transceiver of claim 1, wherein the version of the output signal is in the form of single-ended or balanced quadrature phase signals.

6. The transceiver of claim 5, wherein the frequency shift unit is configured to combine the single-ended or balanced quadrature phase signals to obtain the frequency shifted signal.

7. The transceiver of claim 6, wherein the frequency shift unit comprises input terminals to receive the single-ended or balanced quadrature phase signals, one or two output terminals, and between any combination of the input terminal and the output terminal a switch to couple the input terminal to the output terminal, wherein the frequency shift unit further comprises a control signal generation unit configured for generating control signals to control the switches.

8. The transceiver of claim 7, wherein the control signals generator is a type of Low Frequency Local Oscillator to generate control signals in the form of quadrature phase signals.

9. The transceiver of claim 7, wherein the switches have switching instants which differs from switching instants of switches of the sampling unit.

10. The transceiver of claim 9, wherein sampling instants of the sampling unit are in response to a positive edge of a sampling clock signal and the switching instants of the switches are in response to a negative edge of the sampling clock signal.

11. The transceiver of claim 9, wherein sampling instants of the sampling unit are in response to a negative edge of a sampling clock signal and the switching instants of the switches are in response to a positive edge of the sampling clock signal.

12. The transceiver of claim 1, further configured to operate in a multitude of channel states, wherein each channel state has a corresponding transmission and receiving frequency generated by the frequency synthesizer, wherein the predefined frequency shift $f_{shift}$, the frequency of the frequency shifted output signal $f_{mix,t}$ when generating the transmission frequency and the frequency of the shifted output signal $f_{mix,r}$ when generating the receiving frequency applies to the following equation:

$$(f_{smp}/2) \times \text{truncate}(f_{mix,t}/f_{smp}/2) < f_{mix,r} < (f_{smp}/2) \times (1+\text{truncate}(f_{mix,t}/f_{smp}/2)).$$

13. The transceiver of claim 1, wherein the transceiver is an IEEE 802.15.4 transceiver.

14. A frequency synthesizer for use in a communication device,
wherein the frequency synthesizer is configured to generate M different output signals for use as one or more of a carrier signal for transmission and a signal with a channel frequency for reception,
wherein M is an integer greater than 4, each output signal has a corresponding predefined frequency, and the predefined frequencies are within a frequency band with a predefined channel frequency-range (CFR), wherein the frequency synthesizer is a sub-sampling based frequency synthesizer with a sampling frequency $f_{smp}$, wherein CFR is greater than $f_{smp}$, the frequency synthesizer comprising a frequency shift unit based on a Hartley modulator and configured for shifting a version of the output signal over a predefined frequency shift $f_{shift}$ to obtain a frequency shifted signal which is supplied to a sampling unit of the sub-sampling based frequency synthesizer, wherein $-f_{smp}/2 \leq f_{shift} \leq +f_{smp}/2$ and the frequency shift unit is configured to use for the generation of each of the M different output signals corresponding predefined frequency shift $f_{shift}$, wherein $f_{smp}$ is a multiple of $f_{shift}$.

15. The frequency synthesizer of claim 14, wherein the sub-sampling based frequency synthesizer is a sub-sampling based frequency locked loop frequency synthesizer.

16. The frequency synthesizer of claim 14, wherein $f_{smp}=2^x \times f_{shift}$, wherein x is an integer greater than 0.

17. The frequency synthesizer of claim 14, wherein the sampling unit is a binary sampler.

18. The frequency synthesizer of claim 14, wherein the version of the output signal is in the form of single-ended or balanced quadrature phase signals.

19. The frequency synthesizer of claim 18, wherein the frequency shift unit is configured to combine the single-ended or balanced quadrature phase signals to obtain the frequency shifted signal.

20. The frequency synthesizer of claim 19, wherein the frequency shift unit comprises input terminals to receive the single-ended or balanced quadrature phase signals, one or two output terminals, and between any combination of the input terminal and the output terminal a switch to couple the input terminal to the output terminal, wherein the frequency shift unit further comprises a control signal generation unit configured for generating control signals to control the switches.

21. The frequency synthesizer of claim 20, wherein the control signals generator is a type of Low Frequency Local Oscillator to generate control signals in the form of quadrature phase signals.

22. The frequency synthesizer of claim 20, wherein the switches have switching instants which differs from switching instants of switches of the sampling unit.

23. The frequency synthesizer of claim 22, wherein sampling instants of the sampling unit are in response to a positive edge of a sampling clock signal and the switching instants of the switches are in response to a negative edge of the sampling clock signal.

24. The frequency synthesizer of claim 22, wherein sampling instants of the sampling unit are in response to a negative edge of a sampling clock signal and the switching instants of the switches are in response to a positive edge of the sampling clock signal.

* * * * *